United States Patent
Yedid

(10) Patent No.: US 6,504,869 B2
(45) Date of Patent: *Jan. 7, 2003

(54) MECHANISM FOR INTERPOLATING AMONG SAMPLES OF RECEIVED COMMUNICATION SIGNAL USING ASYNCHRONOUS HIGH SPEED CLOCK WHICH IS A NOMINAL MULTIPLE OF RECOVERED SIGNALLING BAUD RATE

(75) Inventor: Harry Yedid, Huntsville, AL (US)

(73) Assignee: Adtran, Inc., Huntsville, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/858,788

(22) Filed: May 16, 2001

(65) Prior Publication Data

US 2002/0031197 A1 Mar. 14, 2002

Related U.S. Application Data

(63) Continuation of application No. 09/017,590, filed on Feb. 3, 1998, now Pat. No. 6,240,132.

(51) Int. Cl.[7] .................................................. H04H 7/30
(52) U.S. Cl. ...................................... 375/232; 375/355
(58) Field of Search ................................. 375/229, 232, 375/233, 346, 350, 355; 708/290, 313

(56) References Cited

U.S. PATENT DOCUMENTS

| | | | |
|---|---|---|---|
| 4,692,931 A | * 9/1987 | Ohsawa | 327/141 |
| 5,457,456 A | 10/1995 | Norsworthy | 341/61 |
| 5,513,209 A | 4/1996 | Holm | 375/354 |
| 5,748,126 A | 5/1998 | Ma et al. | 341/143 |
| 5,786,778 A | 7/1998 | Adams et al. | 341/61 |
| 5,881,110 A | * 3/1999 | Cochran | 329/307 |
| 5,963,160 A | 10/1999 | Wilson et al. | 341/143 |
| 6,128,357 A | * 10/2000 | Lu et al. | 329/325 |
| 6,240,132 B1 | * 5/2001 | Yedid | 375/232 |
| 6,289,064 B1 | * 9/2001 | Hiramatsu et al. | 370/514 |

* cited by examiner

Primary Examiner—Don N. Vo
(74) Attorney, Agent, or Firm—Allen, Dyer, Doppelt, Milbrath & Gilchrist, P.A.

(57) ABSTRACT

An analog input to an interpolation scheme for a digital signal processing receiver is digitized by an oversampling sigma-delta modulator running at a clock frequency that is a multiple of the nominal baud rate. The digitized signal sample stream and a delayed version thereof are shifted through finite impulse response (FIR) filters. The outputs of the FIR filters are coupled to a linear interpolator at a time determined by a carry-out of a divide-by-M counter, so as to decimate the digitized inputs to the FIR filters by the ratio of the oversampling clock to the baud clock. The control path to the interpolator includes a digital phase locked loop containing a linear canceler, to which data from an echo canceler and data decisions from an equalizer are supplied, and from which a timing error input is supplied to a loop filter. The output of the loop filter is supplied to a threshold comparator which outputs an add/delete count signal to a modulo N up/down counter that controls the coupling of samples to the interpolator. At baud time, the two decimated FIR filter samples A and B are subjected to a linear interpolation operator $A+(B-A)*n/N$, where n is a count value provided by the up/down counter of the total number of times that the comparator has initiated an add or delete command, and serves as a software pointer to the signal value to be interpolated.

1 Claim, 3 Drawing Sheets

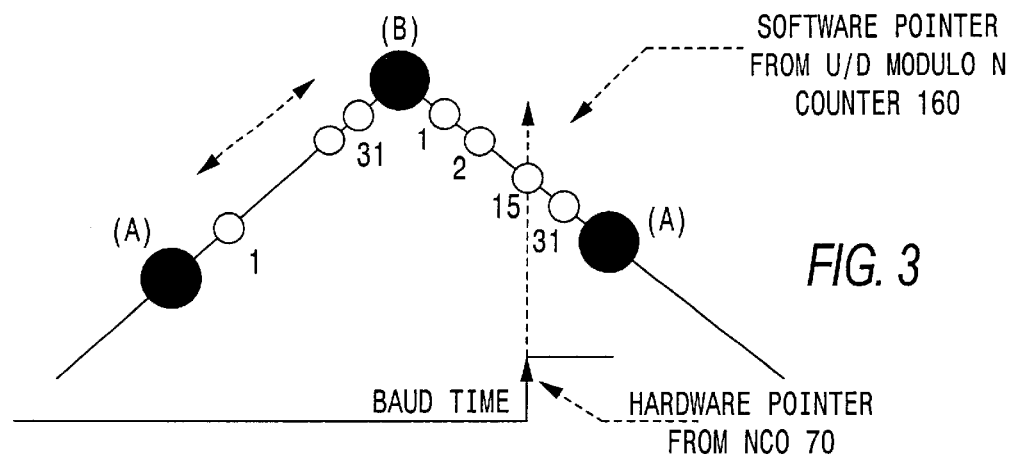
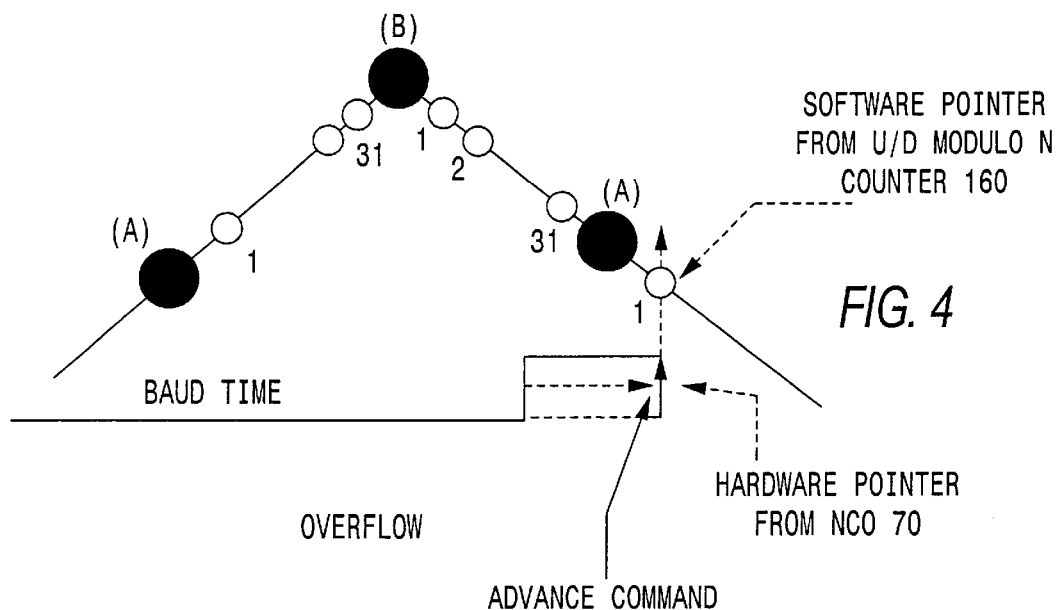
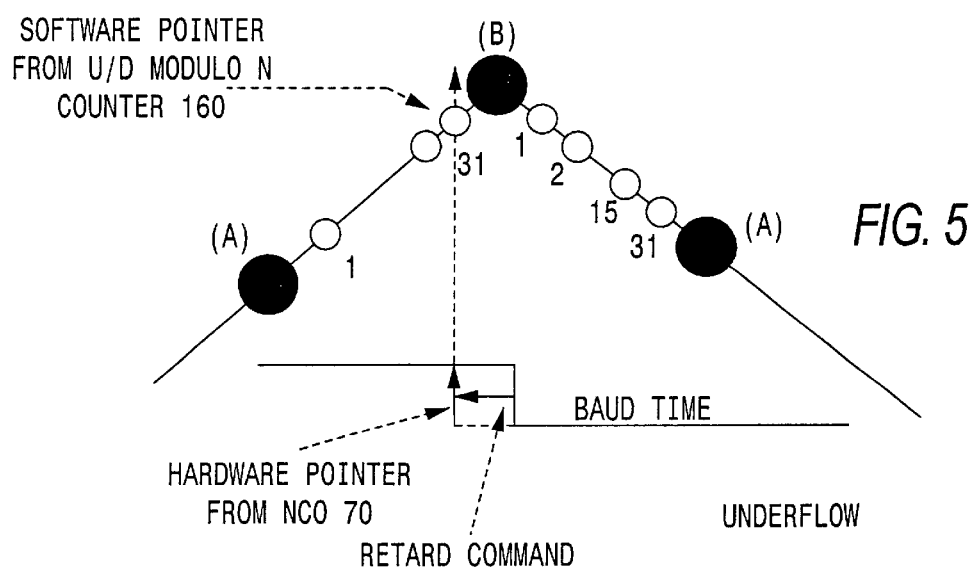

MECHANISM FOR INTERPOLATING AMONG SAMPLES OF RECEIVED COMMUNICATION SIGNAL USING ASYNCHRONOUS HIGH SPEED CLOCK WHICH IS A NOMINAL MULTIPLE OF RECOVERED SIGNALLING BAUD RATE

CROSS-REFERENCE TO RELATED APPLICATIONS

This application is a continuation of application U.S. Pat. Ser. No. 09/017,590, filed on Feb. 3, 1998, now U.S. Pat. No. 6,240,132, issued May 29, 2001, which relates to subject matter disclosed in co-pending U.S. patent application Ser. No. 08/658,581, filed Jun. 5, 1996, by H. Yedid, entitled: "Control of Symbol Timing Recovery in Accordance with Cursor and Precursor Taps of Linear Equalizer," hereinafter referred to as the '581 application, now abandoned, which is assigned to the assignee of the present application, and the disclosure of which is incorporated herein.

FIELD OF THE INVENTION

The present invention relates in general to communication systems, and is particularly directed to a mechanism for deriving the value of an interpolated communication signal as a function of an asynchronous high speed clock, and the relative position of the recovered received baud epoch. This clock is adjusted using the scheme described in the above-referenced co-pending '581 patent application.

BACKGROUND OF THE INVENTION

As discussed in the above-referenced '581 application, in order to accurately recover originally transmitted information signals that have been transported over a limited bandwidth dispersive channel, such as a copper telephone line, digital communication systems process successive samples of received signals through one or more signal processing operators, such as an adaptive transversal filter, which functions to reduce or minimize intersymbol interference (ISI) in the received signal path.

FIG. 1 diagrammatically shows a non-limiting example of a cascaded arrangement of a T-spaced feedforward linear transversal filter section 10 and a decision feedback (DFB) equalizer and data decision block 20, to which a received signal sample plus shaped noise (NEXT) is applied at the appropriate received timing epoch (i.e., symbol rate) derived by a timing epoch recovery subsystem. In accordance with current practice, the signal processing mechanism of interest is preferably implemented using digital components, so that the received signal is initially sampled and digitized by an analog-to-digital converter (ADC).

The feedforward linear filter section 10 typically comprises a delay line 12, each successive delay stage ($z^{-1}$) of which stores a respective received sample (clocked at the symbol rate). Using a receiver clock signal derived from the timing signal recovery subsystem, such as a application specific integrated circuit (ASIC) digital phase locked loop (DPPL) 30, successive received samples provided over an input link 11 through automatic gain control amplifier circuitry 19 are clocked into and through the respective $z^{-1}$ stages of the delay line 12.

As successive received signal samples are clocked through the delay line 12, the contents of its respective $z^{-1}$ stages are multiplied in multipliers 13 by respective weighting coefficients $W_i$ and then summed in an accumulator 14, to produce a combined output for application to the decision feedback section 20, from the output of which data decision estimates are derived on output line 21. The output of the accumulator 14 is adjusted by subtracting the output of decision feedback section 20, as shown at subtraction operator 16. The effect of this subtraction is to remove intersymbol interference caused by the postcursors of the previously detected symbols.

The data decision estimates provided via output line 21 are derived on a symbol by symbol basis, by means of a symbol decision mechanism 22 (such as a slicer, which produces an estimate of the baud based on which region of spaced boundaries the received baud (at the output of a substraction operator 16) falls on. These output data decisions on output line 21 are then fed back to decision feedback equalizer 23, in order to remove intersymbol interference from future symbols.

Like the feedforward linear transversal filter section 10, decision feedback equalizer 23 also includes a delay line, the contents of respective stages of which are multiplied in respective multipliers by associated weighting coefficients and then summed in an accumulator to produce a combined output on link 24. As described above, this combined output 24 is subtracted in subtraction operator 16 from the output of accumulator 14 of the feedforward section 10.

In order to adjust the weighting coefficients for the feedforward linear transversal filter section 10 and the decision feedback section 23, a residual error signal may be obtained by differentially combining at 26 the data decision estimates at output 21 with the output of subtraction operator 16. This residual error signal is then coupled to a tap (weighting coefficient) update mechanism 40, which updates (recalculates) the respective weighting coefficients $W_i$ for multipliers 13, as well as the coefficients $W1_i$ of the decision feedback section 23.

In the cascaded linear equalizer—decision feedback equalizer arrangement of FIG. 1, in order to adjust the frequency and phase of the local receiver clock, so that it tracks the remote transmitter clock, the received clock recovery loop 30 is coupled to receive the error signal derived by a linear canceler section 50. Linear canceler section 50 functions as a predictor and is coupled to receive the successively received samples on received sample input link 11 and the symbol decision value estimates on link 21 as generated by symbol decision mechanism 22 of decision feedback section 20.

The linear canceler section 50 includes an alignment delay stage 51, to which successive received symbol samples on input link 11 are coupled, and the output of which is coupled to a subtraction operator 52. A multistage linear canceler section 53 consisting of a delay line and associated coefficients is coupled to receive the successive output symbol estimates on link 21, and provides signal estimates to the subtraction operator 52. The difference output of subtraction operator 52 is then used to update the coefficients employed by linear canceler section 53. In order to generate a timing error signal for adjusting the clock signal output by the received clock recovery loop 30, the ratio between the sampled signal value (A) associated with the cursor tap stage and that (B) of the first precursor tap stage of the linear canceler section 53 is calculated and compared with an offset value associated with the transmission line of interest.

Prior to calculating the ratio of the first precursor tap value to the cursor tap value, the cursor tap value on link 56 is normalized by a 'scaling' gain stage 58. The offset value is typically predetermined (calculated) by conducting (laboratory) measurements upon the type of transmission line being used and storing a set of such values (associated with respectively different line lengths) in a look-up table. Once the equipment is installed, the receiver is programmed to use one of the offsets based on the value set by the automatic gain control amplifier circuitry 19.

In the ideal situation (no sample timing error), the precursor/cursor ratio (B/A) will match the expected offset value, indicating that the sampling clock is aligned with the peak of the received baud. However, in reality, due to master oscillator sensitivity to temperature gradients, it can be expected that the two will not match. This difference between successive precursor/cursor signal value ratios represents a timing error used by the timing recovery phase locked loop (PLL) 30 to adjust the recovered clock.

Where cost is not necessarily a major factor, such as in government-funded applications, the phase locked loop of the receiver's timing recovery subsystem may include a high precision voltage controlled oscillator and attendant parameter (e.g., temperature) variation compensation components, that are configured to enable the receiver's analog-to-digital converter to sample received signals at the optimum baud timing. In the commercial world, however, where competition dictates that cost be minimized without substantial loss in performance, the supplier of communication equipment does not have the luxury of increasing the complexity (and expense) of a given signal processing architecture, in order to achieve 'the best of all possible worlds'.

Thus, there is a need to provide a signal processing mechanism for digital communication signal recovery, that effectively allows continued use of digital components to the extent possible, that facilitates ASIC implementation, yet provides sampling time correction and sampled signal interpolation as necessary to accommodate application parameters that can be expected to vary among different system installations.

SUMMARY OF THE INVENTION

In accordance with the present invention, the foregoing objective is successfully achieved by a timing recovery mechanism for accurately interpolating the value of communication signal as a function of an asynchronous high speed clock and the relative position of the recovered received baud epoch. As noted briefly above, this clock is adjusted by the scheme described in the above-referenced co-pending '581 patent application.

As will be described in detail below, in the architecture of a digital signal processing receiver that incorporates the timing recovery and signal sample interpolation scheme of the present invention, digitizing the received analog signal stream of interest is accomplished using an oversampling sigma-delta modulator, under control of a master oscillator or high frequency clock. The output of a sigma-delta digitizer is similar to that produced by a pulse width modulation process, consisting of a binary steam of 'ones' and 'zeros' of different pulse widths (i.e. pulses are very. close or farther apart depending on where the analog signal is sampled) and running at an oversampling clock having a clock frequency that is a multiple of the nominal baud rate clock.

The binary signal sample stream and a delayed (by the period of the oversampling clock) version of the sampled signal stream are continuously shifted through two identical finite impulse response (FIR) filters. The outputs of the FIR filters are computed only at a time determined by a carry-out (at the baud clock) of a divide-by-M counter, so that the inputs to the FIR filters are decimated by the ratio of the master oscillator clock to the baud clock. This decimation operation produces two samples that are available to a linear interpolator at the baud time.

The control path to the interpolator includes a digital phase locked loop containing a linear canceler, to which data from an echo canceler and data decisions from an equalizer are supplied. The linear canceler operates as a predictor to replicate the pulse response of the loop plant. The cursor and precursor position of the coefficient distribution of the predictor generate a timing error input to a loop filter, which performs filtering as well as providing a correction factor for the digital phase locked loop. The output of the loop filter is compared by a threshold comparator with a pair of upper and lower thresholds, to produce an add/delete count signal to a modulo N up/down counter that controls the operation of a numerically controlled oscillator.

At baud time, the two decimated FIR filter samples are processed in accordance with the linear interpolation expression $A+(B-A)*n/N$, where A and B are the undelayed and delayed decimated samples, respectively, n is a numerical (digital) value provided by the modulo N up/down counter representative of the total number of times n that the threshold comparator has initiated an add or delete command, and serves as a software pointer to the point to be interpolated between the two samples A and B, and N is the modulus of the up/down counter. The modulo N up/down counter performs two functions: it stores the total number of times n that the threshold comparator has initiated an add or delete command. At baud time this number n represents the software pointer to the point to be interpolated between samples A and B. The modulo N up/down counter also generates a hardware advance/retard command to a numerically controlled oscillator, after it has reached its maximum count (modulo N) and is reset to zero.

The advance or retard function is the result of the modulo N up/down counter overflowing (as a result of continuously counting UP) or underflowing (as a result of continuously counting DOWN). For the case of either counter underflow or underflow, and because of the finite nature of the counting scheme (modulo N), the software pointer must point to the correct sample after overflow or underflow conditions occurs. For this purpose, the invention takes advantage of an additional advance/retard command from the up/down counter, in which an underflow/overflow condition is used to force the numerically controlled oscillator to momentarily divide by a first value (to effect an advance) or a second value (to effect a retard), thus moving it to the correct sample when the event occurs. As a consequence, it is not necessary to separately keep track of where the software pointer is pointing, in order to ensure that the correct sample is selected when either of these two extreme conditions occurs.

BRIEF DESCRIPTION OF THE DRAWINGS

FIGS. 3, 4 and 5 are respective signal interpolation diagrams associated with the operation of FIG. 2.

DETAILED DESCRIPTION

Figure 1:
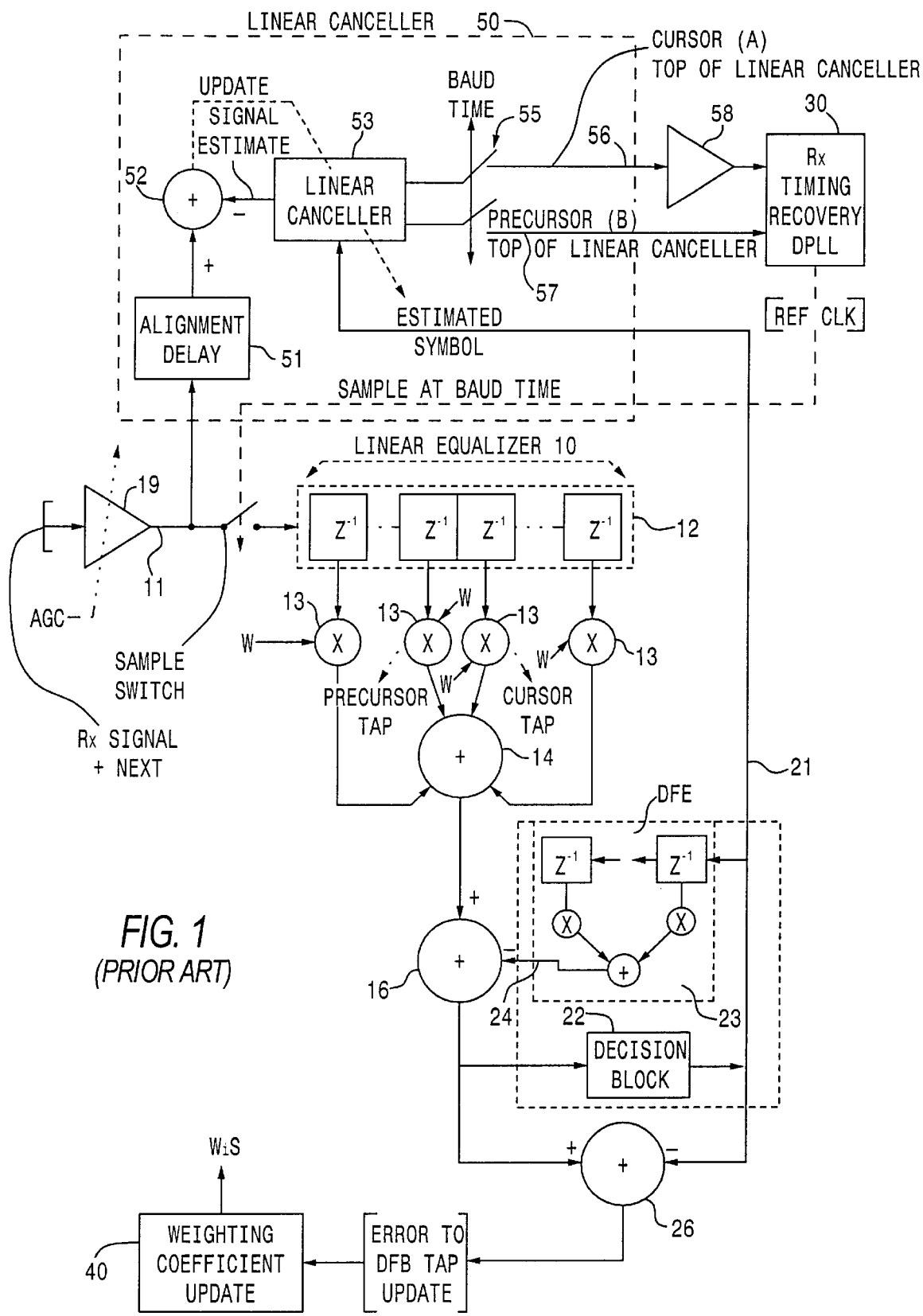
FIG. 1 diagrammatically illustrates the architecture of a conventional decision feedback (DFB) equalizer arrangement.

Before describing in detail the interpolation mechanism of the present invention, it should be observed that the invention primarily resides in what is effectively a prescribed arrangement of conventional communication circuits and associated digital signal processing components and attendant supervisory control routines, that control the operations of such circuits and components. As a consequence, the configuration of such circuits and components and the manner in which they are interfaced with other communication system equipment have, for the most part, been illustrated in the drawings by readily understandable block diagrams, which show only those specific details that are pertinent to the present invention, so as not to obscure the disclosure with details which will be readily apparent to those skilled in the art having the benefit of the description herein. Thus, the block diagram illustrations are primarily intended to present the major components of the system in a convenient functional grouping and signal processing sequence, whereby the present invention may be more readily understood.

Figure 2:
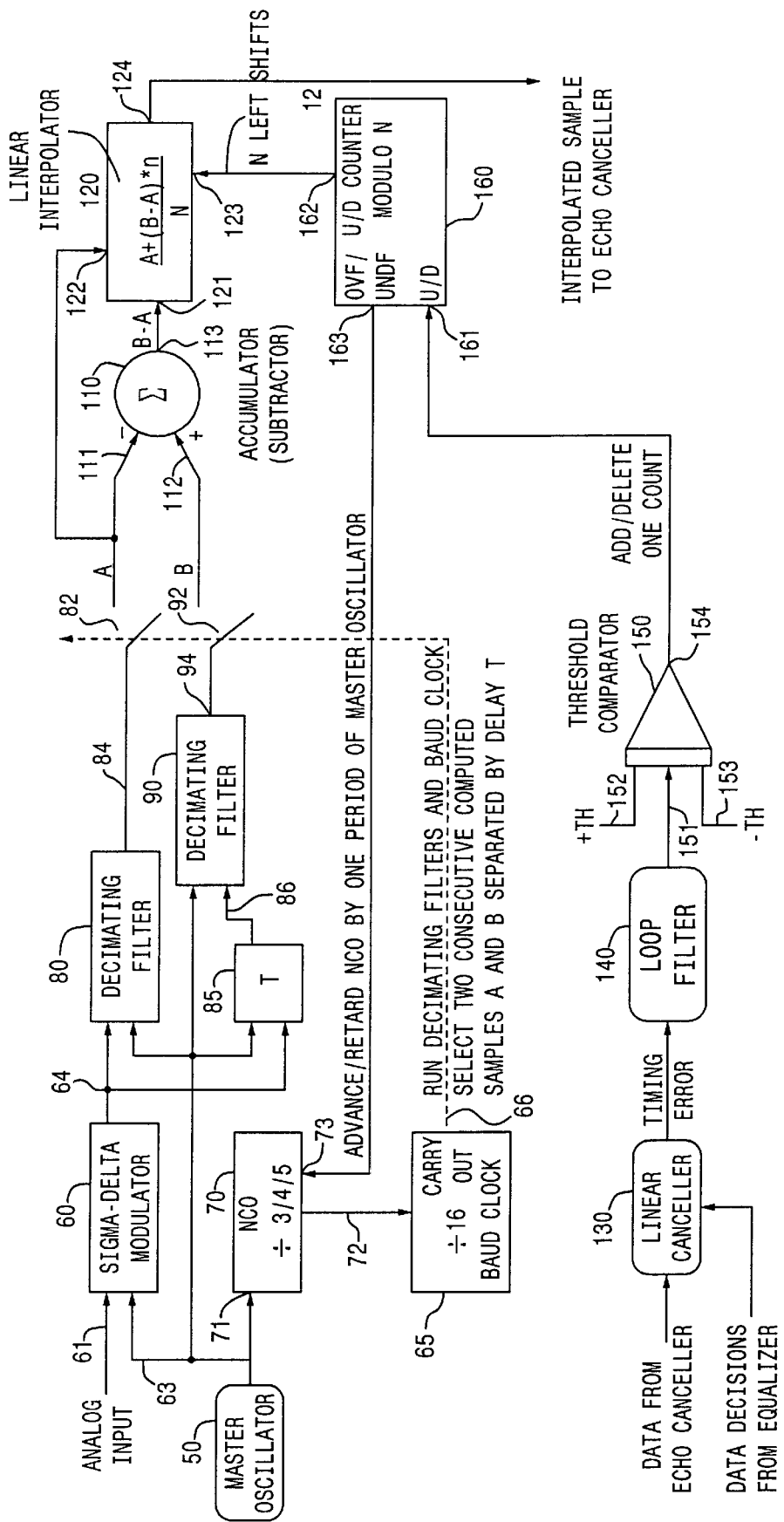
FIG. 2 diagrammatically illustrates the architecture of a digital signal processing receiver that incorporates the linear interpolation mechanism of the present invention.

Referring now to FIG. 2, the architecture of a digital signal processing receiver that incorporates the interpolation mechanism of the present invention is diagrammatically illustrated as comprising an analog signal input port 61 to which a received analog signal is supplied. Input port 61 is coupled to an oversampling sigma-delta modulator 60, which is operative to digitize the analog signal, under control of a master oscillator (high frequency clock) 50, the output of which is coupled to the clock input 63 of sigma-delta modulator 60.

As described briefly above, the (digital) output of the sigma-delta modulator 60 is similar to that produced by a pulse width modulation process, in that it consists of a binary steam of ones and zeros of different pulse widths, in which the pulses are very close together or farther apart depending on the point at which the analog input signal is sampled. The oversampling high frequency clock signal applied to clock port 63 has a clock frequency that is a relatively large multiple of the nominal baud rate clock (e.g., 32×, 64×. . . 96×the baud clock frequency).

The binary sample stream generated by sigma-delta modulator 60 is coupled via an output link 64 to a first decimating FIR filter 80 and, via a delay circuit 85, to a second decimating FIR filter 90. Delay circuit 85 is operative to delay the digitized signal stream by the period of the oversampling clock supplied via link 63. Under control of the high speed oversampling clock generated by the master oscillator 50, each of the undelayed signal on link 64 and the delayed version on line 86 from the delay circuit 85 are continuously shifted through the two (identical) FIR filters 80 and 90.

The outputs of FIR filters 80 and 90, which reject all high frequency components generated by the sigma-delta modulator 50, are coupled or gated through respective controlled switches/gates 82 and 92. These controlled switches are operative to provide subsampled outputs at a rate lower than the oversampling clock, in particular at a rate corresponding to a baud clock supplied to switch control inputs thereof via a link 66 from a divide-by-M divider or baud clock generator 65 (where M=16 as a non-limiting example). Since the FIR filters 80 and 90 are external to the sigma-delta modulator 60, their shape and characteristics can be varied by simply changing their associated coefficient arrays.

Thus, at each sample time, the respective outputs of FIR filters 80 and 90 represent two consecutive samples A and B of the analog signal. These outputs are computed at a time determined by a carry-out (at the baud clock) of the divide-by-M counter 65, so that the inputs to FIR filters 80 and 90 may be decimated by the ratio of the master oscillator clock on line 63 to the baud clock on line 66. This decimation operation thus produces two samples A and B on respective links 84 and 94 that are coupled via switches 82 and 92 at baud time to a linear interpolator 120.

The control path to the linear interpolator 120 includes a digital phase locked loop containing a linear canceler 130, to which data from an echo canceler and data decisions from an equalizer are supplied. As noted previously, the linear canceler 130 operates as a predictor to replicate the pulse response of the loop plant. The cursor and precursor position of the coefficient distribution of the linear canceler 130 produce a timing error input to a loop filter 140, which performs filtering as well as providing a correction factor for the phase locked loop. The output of the loop filter 140 is coupled to a first input 151 of a threshold comparator 150. The threshold comparator 150 compares the output of the loop filter with upper and lower thresholds +TH and −TH supplied to inputs 152 and 153, respectively, so as to produce an add/delete count signal at output 154. output 154 is coupled to an input 161 of a modulo N up/down counter 160, which controls the operation of a numerically controlled oscillator 70 and the linear interpolator 120.

At baud time, the two samples A and B from the FIR filters 80 and 90 are coupled to respective inputs 111 and 112 of a differential accumulator 110, the output 113 of which is coupled to an input 121 of the linear interpolator 120. As described above, the linear interpolator 120 is operative to perform a linear interpolation operation, in which an interpolated signal point IP is defined by the expression A+(B−A)*n/N, where n is a numerical (digital) value provided by the modulo N up/down counter 160 representative of the total number of times n that the threshold comparator 150 has initiated an add or delete command, and serves as a software pointer to the point to be interpolated between the two decimated samples A and B, and N is the modulus of the up/down counter 160.

To implement this operation, the decimated sample B and the two's complement of the decimated sample A are summed in an accumulator 110, to produce a difference value B−A, which is coupled to a shift register within the linear interpolator 120. The shift register shifts the output (B−A) to the right by the numerical value n to perform a multiplication of (B−A) by n, and the resulting product (B−A)*n is then shifted left N times, to produce the value the (B−A)*n/N. The value of n is provided to input 123 of the interpolator 120 from the output 162 of the modulo N up/down counter 160.

Counter 160 performs a dual function. First it stores the number of times n that the threshold comparator 150 has initiated an add or delete command (i.e. add a count to count UP or delete a count to count DOWN). The number n is the result of all the UP counts and all the DOWN counts. As shown in the interpolation diagram of FIG. 3, at baud time, the number n serves as a software pointer to the signal value to be interpolated between samples A and B, and is used to perform the shifting operation described above. In the example illustrated in FIG. 3, n equals 15.

The modulo N up/down counter 160 also generates a hardware advance/retard command to a control input 73 of the numerically controlled oscillator 70, after it has reached its maximum count (modulo N) and resets to zero. The numerically controlled oscillator 70 has an input 71 coupled to link 63 to receive the clock output of master oscillator 50. The advance or retard function is the result of the up/down counter 160 overflowing (counting UP all the time) or underflowing (counting DOWN all the time). In the example of FIG. 3, counter 160 has neither overflowed nor underflowed, so that the operation of the linear interpolator 120 performs a linear interpolation of the signal value at the interpolation point in accordance with the expression (B−A)*n/N, as described above.

For the case of counter overflow (FIG. 4) and the case of counter underflow (FIG. 5), however, different operations occur. For an overflow condition, the up/down counter 160 will have reached its terminal count (e.g., thirty-one for a five bit counter) and will have reset to zero. For an underflow condition, the counter 160 will have counted down to its terminal count (e.g., 0) and then be set to its maximum value (e.g. 31 for a five bit counter). For both of these cases and because of the finite nature of the counting scheme (module N), the software pointer must point to the correct sample after an overflow or an underflow condition occurs.

There are various ways to keep track of where the software pointer should point, such as, but not limited to storing a sample stream and deciding via multiplexing which samples to select at interpolation time. The present invention provides a relatively easy scheme that takes advantage of an additional advance/retard signal available at the output 163 from the up/down counter 160. This advance/retard signal is coupled to advance/retard input 73 of the numerically controlled oscillator 70, so as to automatically correct for an overflow or underflow condition.

More particularly, as shown in FIG. 4, when an overflow condition occurs, the signal on input 73 will force the numerically controlled oscillator 70 to momentarily divide by a value (e.g., three) that 'advances' the count to the correct sample point when the overflow event occurs. Similarly, as shown in FIG. 5, an underflow condition will force the numerically controlled oscillator 70 to momentarily divide by a value (e.g., five) that 'retards' the count, thus moving it to the correct sample point when the underflow event occurs. As a result, it is unnecessary to keep track of where the software pointer IP is pointing, in order to make sure that the correct sample is selected when either of these extreme conditions occurs.

It will be readily appreciated therefore, that by taking advantage of the functionality of a modulo N up/down counter to control both a numerically controlled decimation oscillator and digital shift components of a linear interpolator, the signal sample interpolation mechanism of the present invention is able to provide a practical scheme for deriving the value of an interpolated communication signal as a function of an asynchronous high speed clock and the relative position of the recovered received baud epoch.

While I have shown and described an embodiment in accordance with the present invention, it is to be understood that the same is not limited thereto but is susceptible to numerous changes and modifications as are known to a person skilled in the art, and I therefore do not wish to be limited to the details shown and described herein, but intend to cover all such changes and modifications as are obvious to one of ordinary skill in the art.

What is claimed is:

1. A signal processor comprising:

an digitizer that oversamples said signal using an oversampling clock whose frequency is a multiple of a nominal baud rate of said signal, and outputs a digitized signal sample stream and a delayed version of said digitized signal sample stream;

respective finite impulse response (FIR) filter stages which filter said digitized signal sample stream and said delayed version of said digitized signal sample stream;

a linear interpolator coupled to receive FIR-filtered samples A and delayed FIR-filtered samples B of said signal at a time determined by contents of an oversampling clock signal divider, and thereby effectively decimate said samples by the ratio of said oversampling clock to said baud clock;

a digital phase locked loop coupled to receive a timing error signal from a timing recovery path for said signal; and a loop filter coupled to a comparator which controllably modifies a modulo N up/down counter that controls coupling of said samples to said interpolator by said oversampling clock signal divider, so that, at baud time, decimated FIR filter samples A and B are subjected to a linear interpolation operator A+(B−A)*n/N, where n is a count value of said up/down counter of the number of times said comparator has modified said modulo N up/down counter.

* * * * *